United States Patent
Imamura et al.

(10) Patent No.: US 9,828,254 B2
(45) Date of Patent: Nov. 28, 2017

(54) SURFACE-COATED CUTTING TOOL

(71) Applicant: SUMITOMO ELECTRIC HARDMETAL CORP., Itami-shi (JP)

(72) Inventors: Shinya Imamura, Sorachi-gun (JP); Anongsack Paseuth, Sorachi-gun (JP); Takanori Detani, Sorachi-gun (JP); Hideaki Kanaoka, Sorachi-gun (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 0 days.

(21) Appl. No.: 15/101,849

(22) PCT Filed: Aug. 28, 2015

(86) PCT No.: PCT/JP2015/074505
§ 371 (c)(1),
(2) Date: Jun. 3, 2016

(87) PCT Pub. No.: WO2017/037796
PCT Pub. Date: Mar. 9, 2017

(65) Prior Publication Data
US 2017/0190591 A1    Jul. 6, 2017

(51) Int. Cl.
*C01F 7/02* (2006.01)
*C04B 37/00* (2006.01)
*B23B 27/14* (2006.01)

(52) U.S. Cl.
CPC .............. *C01F 7/02* (2013.01); *B23B 27/148* (2013.01); *C04B 37/001* (2013.01);
(Continued)

(58) Field of Classification Search
USPC .......... 51/307, 309; 428/212, 216, 336, 698, 428/601, 702, 704; 407/119
See application file for complete search history.

(56) References Cited

U.S. PATENT DOCUMENTS

2003/0094085 A1   5/2003   Ueda et al.
2004/0224159 A1   11/2004  Oshika et al.
(Continued)

FOREIGN PATENT DOCUMENTS

JP    2004-188575 A    7/2004
JP    2004-284003 A    10/2004
(Continued)

OTHER PUBLICATIONS

International Search Report in PCT International Application No. PCT/JP2015/074505, dated Oct. 6, 2015.

*Primary Examiner* — Archene Turner
(74) *Attorney, Agent, or Firm* — Venable LLP; Michael A. Sartori; Kerri M. Patterson

(57) ABSTRACT

A surface-coated cutting tool according to the present invention includes a coating. The coating has an $\alpha$-$Al_2O_3$ layer. The $\alpha$-$Al_2O_3$ layer includes a lower layer portion and an upper layer portion. When respective crystal orientations of crystal grains of $\alpha$-$Al_2O_3$ are specified by performing EBSD analyses with an FE-SEM on a cross-section obtained when the $\alpha$-$Al_2O_3$ layer is cut along a plane including a normal line of a surface of the $\alpha$-$Al_2O_3$ layer and a color map is prepared based on the crystal orientations, in the color map, an area in the upper layer portion occupied by the crystal grains of which normal direction of a (001) plane is within $\pm 10°$ with respect to a normal direction of the surface of the $\alpha$-$Al_2O_3$ layer is equal to or more than 90%, and such an area in the lower layer portion is equal to or less than 50%.

6 Claims, 7 Drawing Sheets

(52) U.S. Cl.
CPC ........ *C04B 37/005* (2013.01); *B23B 2224/04* (2013.01); *B23B 2224/28* (2013.01); *B23B 2224/32* (2013.01); *B23B 2224/36* (2013.01); *B23B 2228/04* (2013.01); *B23B 2228/08* (2013.01); *B23B 2228/105* (2013.01); *B23B 2228/36* (2013.01); *C01P 2002/78* (2013.01); *C04B 2237/08* (2013.01); *C04B 2237/083* (2013.01); *C04B 2237/343* (2013.01); *C04B 2237/36* (2013.01); *C04B 2237/704* (2013.01); *C04B 2237/708* (2013.01); *C04B 2237/72* (2013.01); *C04B 2237/76* (2013.01)

(56) References Cited

U.S. PATENT DOCUMENTS

| | | | |
|---|---|---|---|
| 2004/0224160 A1 | 11/2004 | Ueda et al. | |
| 2005/0042482 A1* | 2/2005 | Okada | C23C 16/30 428/698 |
| 2007/0218242 A1 | 9/2007 | Moriguchi et al. | |
| 2012/0003452 A1* | 1/2012 | Tomita | C23C 16/0272 428/216 |
| 2012/0282049 A1 | 11/2012 | Okada et al. | |
| 2013/0149527 A1* | 6/2013 | Cho | C23C 16/34 428/336 |
| 2014/0287210 A1 | 9/2014 | Tomita et al. | |

FOREIGN PATENT DOCUMENTS

| | | | |
|---|---|---|---|
| JP | 2006-082218 A | | 3/2006 |
| JP | 2007-237310 A | | 9/2007 |
| JP | 2010-207946 A | | 9/2010 |
| JP | 2011-235414 | * | 11/2011 |
| WO | WO-2012/063515 A1 | | 5/2012 |
| WO | WO-2013/031952 A1 | | 3/2013 |

* cited by examiner

SURFACE-COATED CUTTING TOOL

TECHNICAL FIELD

The present invention relates to a surface-coated cutting tool.

BACKGROUND ART

A surface-coated cutting tool having a coating formed on a base material has conventionally been used. For example, Japanese Patent Laying-Open No. 2004-284003 (PTD 1) discloses a surface-coated cutting tool having a coating including an $\alpha$-$Al_2O_3$ layer in which a total area of crystal grains showing a crystal orientation of a (0001) plane is 70% or higher when viewed in a direction of normal to a surface of the layer in a plan view.

Japanese Patent Laying-Open No. 2010-207946 (PTD 2) discloses a surface-coated cutting tool having a coating including an $\alpha$-$Al_2O_3$ layer in which crystal grains observed at a surface have a specific size range when viewed in a direction of normal to a surface of the layer in a plan view.

CITATION LIST

Patent Document

PTD 1: Japanese Patent Laying-Open No. 2004-284003
PTD 2: Japanese Patent Laying-Open No. 2010-207946

SUMMARY OF INVENTION

Technical Problem

In PTDs 1 and 2, with the coating including the $\alpha$-$Al_2O_3$ layer constructed as above, improvement in mechanical characteristics such as resistance to wear and resistance to breakage of a surface-coated cutting tool and resultant longer life of a cutting tool are expected.

In recent working by cutting, however, a speed and efficiency have become high, load imposed on a cutting tool has increased, and life of the cutting tool has disadvantageously become short. Therefore, further improvement in mechanical characteristics of a coating on the cutting tool and longer life of the cutting tool have been demanded.

The present disclosure was made in view of such circumstances, and an object thereof is to provide a surface-coated cutting tool achieving improved mechanical characteristics of a coating and longer life of the cutting tool.

Solution to Problem

A surface-coated cutting tool according to one embodiment of the present disclosure is a surface-coated cutting tool including a base material and a coating formed on the base material, the coating has an $\alpha$-$Al_2O_3$ layer containing a plurality of crystal grains of $\alpha$-$Al_2O_3$, and the $\alpha$-$Al_2O_3$ layer includes a lower layer portion which is located on a base material side in a thickness direction and has a thickness of 1 μm and an upper layer portion which is located on a surface side opposite to the base material side and has a thickness of 2 μm. When respective crystal orientations of the crystal grains are specified by performing electron beam backscattering diffraction (EBSD) analyses with a field emission-type scanning microscope (FE-SEM) on a cross section of the $\alpha$-$Al_2O_3$ layer obtained when the $\alpha$-$Al_2O_3$ layer is cut along a plane including a normal line of a surface of the $\alpha$-$Al_2O_3$ layer and a color map is prepared based on the crystal orientations, in the color map, an area in the upper layer portion occupied by the crystal grains of which normal direction of a (001) plane is within ±10° with respect to a normal direction of the surface of the $\alpha$-$Al_2O_3$ layer is equal to or more than 90%, and an area in the lower layer portion occupied by the crystal grains of which normal direction of the (001) plane is within ±10° with respect to the normal direction of the surface of the $\alpha$-$Al_2O_3$ layer is equal to or less than 50%.

Advantageous Effects of Invention

According to the above, mechanical characteristics of a coating can be improved and life of a cutting tool can further be longer.

DESCRIPTION OF EMBODIMENTS

[Description of Embodiments of Present Invention]

Figure 1:
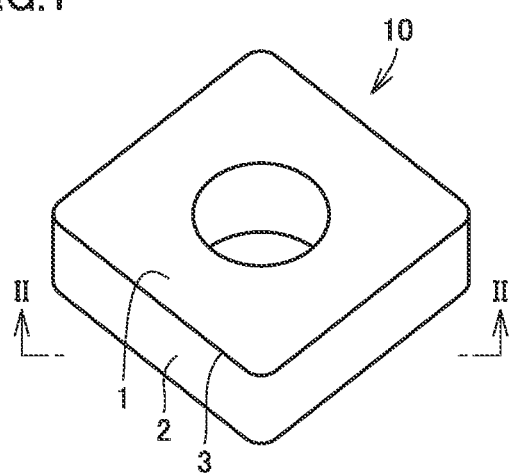
FIG. 1 is a perspective view showing one example of a surface-coated cutting tool according to one embodiment of the present disclosure.

Embodiments of the present invention will initially be listed and described. Regarding crystallographic denotation herein, an individual plane is shown in ( ). Denotation "A to B" herein means an upper limit and a lower limit of a range (that is, not less than A and not more than B), and when a unit is specified not for A but only for B, the unit is common to A and B. A chemical formula such as "TiN" or "TiCN" in which an atomic ratio is not particularly specified herein does not indicate that an atomic ratio of each element is limited only to "1" but encompasses all conventionally known atomic ratios.

[1] A surface-coated cutting tool according to one embodiment of the present disclosure is a surface-coated cutting tool including a base material and a coating formed on the base material, the coating has an $\alpha$-$Al_2O_3$ layer containing a plurality of crystal grains of $\alpha$-$Al_2O_3$, and the $\alpha$-$Al_2O_3$ layer includes a lower layer portion which is located on a base material side in a thickness direction and has a thickness of 1 μm and an upper layer portion which is located on a surface side opposite to the base material side and has a thickness of 2 μm. When respective crystal orientations of the crystal grains are specified by performing electron beam backscattering diffraction (EBSD) analyses with a field emission-type scanning microscope (FE-SEM) on a cross section of the $\alpha$-$Al_2O_3$ layer obtained when the $\alpha$-$Al_2O_3$ layer is cut along a plane including a normal line of a surface of the $\alpha$-$Al_2O_3$ layer and a color map is prepared based on the crystal orientations, in the color map, an area in the upper layer portion occupied by the crystal grains of which normal direction of a (001) plane is within ±10° with respect to a normal direction of the surface of the α-Al$_2$O$_3$ layer is equal to or more than 90%, and an area in the lower layer portion occupied by the crystal grains of which normal direction of the (001) plane is within ±10° with respect to the normal direction of the surface of the α-Al$_2$O$_3$ layer is equal to or less than 50%. According to such an α-Al$_2$O$_3$ layer, the upper layer portion located on the surface side can exhibit high resistance to wear and the lower layer portion located on the base material side can exhibit high adhesion with the base material. Therefore, the surface-coated cutting tool according to [1] achieves excellent mechanical characteristics and longer life.

[2] In the surface-coated cutting tool, preferably, the α-Al$_2$O$_3$ layer has a stress distribution varying in the thickness direction, the surface side of the α-Al$_2$O$_3$ layer has a compressive residual stress, and the base material side of the α-Al$_2$O$_3$ layer has a tensile residual stress. In this case, the surface-coated cutting tool is further longer in life.

[3] In the surface-coated cutting tool in [2], preferably, the stress distribution has a first region where an absolute value of the compressive residual stress continuously increases from the surface side toward the base material side and a second region located on the base material side relative to the first region, where an absolute value of the compressive residual stress continuously decreases and is turned to the tensile residual stress, and successively an absolute value of the tensile residual stress continuously increases, from the surface side toward the base material side, and the first region and the second region are continuous, with an intermediate point where the absolute value of the compressive residual stress is greatest being interposed. Such a surface-coated cutting tool is excellent in balance between resistance to wear and resistance to breakage.

[4] In the surface-coated cutting tool in [2] and [3], preferably, the α-Al$_2$O$_3$ layer has an absolute value of the compressive residual stress not greater than 1000 MPa and an absolute value of the tensile residual stress not greater than 2000 MPa. Such a surface-coated cutting tool is excellent in balance between resistance to wear and resistance to breakage.

[5] In the surface-coated cutting tool, preferably, the coating includes a first intermediate layer between the base material and the Al$_2$O$_3$ layer, and the first intermediate layer is a TiCN layer. Since the TiCN layer has a high hardness, the surface-coated cutting tool including the coating having such a first intermediate layer is excellent in resistance to wear.

[6] In the surface-coated cutting tool in [5], preferably, the coating includes a second intermediate layer between the first intermediate layer and the α-Al$_2$O$_3$ layer, the second intermediate layer is a TiCNO layer or a TiBN layer, and a difference between a greatest thickness and a smallest thickness of the second intermediate layer is not smaller than 0.3 μm. Since such a second intermediate layer can exhibit an effect as an anchor achieving intimate contact between the α-Al$_2$O$_3$ layer and the first intermediate layer, resistance to peel-off of the coating can be enhanced. Therefore, the surface-coated cutting tool including the coating having such a second intermediate layer is excellent in resistance to breakage.

[7] In the surface-coated cutting tool, preferably, the coating includes a surface layer located at an outermost surface, and the surface layer is a TiC layer, a TiN layer, or a TiB$_2$ layer. Toughness of the coating is thus improved.

[Details of Embodiments of Present Invention]

Though one embodiment of the present invention (hereinafter also denoted as the "present embodiment") will be described below, the present embodiment is not limited thereto.

[Surface-Coated Cutting Tool]

Referring to FIG. 1, a surface-coated cutting tool 10 according to the present embodiment (hereinafter simply denoted as a "tool 10") has a rake face 1, a flank face 2, and a cutting edge ridgeline portion 3 at which rake face 1 and flank face 2 intersect with each other. Namely, rake face 1 and flank face 2 are surfaces connected to each other with cutting edge ridgeline portion 3 being interposed. Cutting edge ridgeline portion 3 implements a cutting edge tip end portion of tool 10. Such a shape of tool 10 relies on a shape of a base material which will be described later.

Though FIG. 1 shows tool 10 representing a throwaway chip for turning, tool 10 is not limited thereto and the tool can suitably be used as a cutting tool such as a drill, an end mill, a throwaway tip for a drill, a throwaway tip for an end mill, a throwaway tip for milling, a metal saw, a gear cutting tool, a reamer, and a tap.

When tool 10 is implemented as a throwaway chip, tool 10 may or may not have a chip breaker, and cutting edge ridgeline portion 3 may have a sharp edge (a ridge at which a rake face and a flank face intersect with each other), may be honed (a sharp edge provided with R), may have a negative land (beveled), and may be honed and have a negative land.

Figure 2:
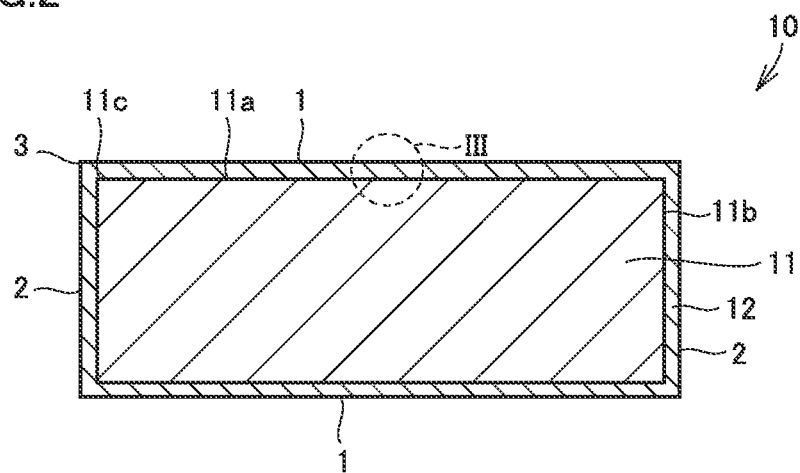
FIG. 2 is a cross-sectional view along the line II-II in FIG. 1.

Referring to FIG. 2, tool 10 has a base material 11 and a coating 12 formed on base material 11. Though coating 12 preferably covers the entire surface of base material 11 in tool 10, a part of base material 11 being not covered with coating 12 or a partially different construction of coating 12 does not depart from the scope of the present embodiment.

[Base Material]

Referring to FIG. 2, base material 11 according to the present embodiment has a rake face 11a, a flank face 11b, and a cutting edge ridgeline portion 11c at which rake face 11a and flank face 11b intersect with each other. Rake face 11a, flank face 11b, and cutting edge ridgeline portion 11c implement rake face 1, flank face 2, and cutting edge ridgeline portion 3 of tool 10, respectively.

For base material 11, any conventionally known base material of such a kind can be employed. Such a base material is preferably exemplified by cemented carbide (for example, WC-based cemented carbide, which contains not only WC but also Co, or to which a carbonitride of Ti, Ta, or Nb may be added), cermet (mainly composed of TiC, TiN, or TiCN), high-speed steel, ceramics (titanium carbide, silicon carbide, silicon nitride, aluminum nitride, or aluminum oxide), a cubic boron nitride sintered object, or a diamond sintered object. Among these various base materials, in particular, WC-based cemented carbide or cermet (in particular, TiCN-based cermet) is preferably selected. This is because such base materials are particularly excellent in balance between hardness and strength at a high temperature and have characteristics excellent as a base material for the surface-coated cutting tool in applications above.

[Coating]

Coating 12 according to the present embodiment includes at least one α-Al$_2$O$_3$ layer which will be described below in detail. Coating 12 can include other layers so long as it includes an α-Al$_2$O$_3$ layer. A composition of other layers is not particularly limited, and examples thereof can include TiC, TiN, TiB, TiBN, TiAlN, TiSiN, AlCrN, TiAlSiN, TiAlNO, AlCrSiCN, TiCN, TiCNO, TiSiC, CrSiN, AlTiSiCO, or TiSiCN. An order of layering is not particularly limited either.

Such coating 12 according to the present embodiment has a function to improve various characteristics such as resistance to wear and resistance to breakage by covering base material 11.

Coating 12 has a thickness preferably from 3 to 35 μm. When coating 12 has a thickness not smaller than 3 μm, shorter life of the tool due to a small thickness of coating 12 can be suppressed. When coating 12 has a thickness not greater than 35 μm, resistance to breakage in an early stage of cutting can be improved.

Coating 12 in which an underlying layer 13, a first intermediate layer 14, a second intermediate layer 15, and an α-$Al_2O_3$ layer 16 are successively stacked from a base material side toward a surface side of coating 12 (upward from below in the figure) representing one example of a preferred construction of coating 12 according to the present embodiment will be described with reference to FIG. 3.

[α-$Al_2O_3$ Layer]

Alpha-$Al_2O_3$ layer 16 in the present embodiment is a layer containing a plurality of crystal grains of α-$Al_2O_3$ (aluminum oxide of which crystal structure is of an α type). Namely, this layer is composed of polycrystalline α-$Al_2O_3$. Normally, these crystal grains have a grain size approximately from 50 to 3000 nm.

Alpha-$Al_2O_3$ layer 16 in the present embodiment satisfies the following requirements. Alpha-$Al_2O_3$ layer 16 includes a lower layer portion which is located on a base material side in a thickness direction and has a thickness of 1 μm and an upper layer portion which is located on a surface side opposite to the base material side and has a thickness of 2 μm. When respective crystal orientations of the crystal grains composed of α-$Al_2O_3$ are specified by performing EBSD analyses with an FE-SEM on a cross section of α-$Al_2O_3$ layer 16 obtained when α-$Al_2O_3$ layer 16 is cut along a plane including a normal line of a surface of α-$Al_2O_3$ layer 16 and a color map is prepared based on the crystal orientations, in the color map, an area in the upper layer portion occupied by crystal grains of which normal direction of a (001) plane is within ±10° with respect to a normal direction of the surface of the α-$Al_2O_3$ layer (hereinafter also denoted as "(001) plane orientation crystal grains") is equal to or more than 90%, and an area in the lower layer portion occupied by the (001) plane orientation crystal grains is equal to or less than 50%.

A specific method for creating a color map will now be described with reference to FIGS. 2 to 4. A lower surface 16b of α-$Al_2O_3$ layer 16 shown in FIG. 4 is a surface located on a side of base material 11 in FIG. 3, that is, a surface in contact with second intermediate layer 15, and an upper surface 16a is a surface located on a surface side of coating 12 opposite to the side of base material 11, that is, the surface of α-$Al_2O_3$ layer 16. When another surface layer is further formed on α-$Al_2O_3$ layer 16, a surface in contact with the surface layer is defined as upper surface 16a.

Initially, an α-$Al_2O_3$ layer is formed based on a manufacturing method which will be described later. Then, the formed α-$Al_2O_3$ layer (including the base material) is cut to obtain a cross-section perpendicular to the α-$Al_2O_3$ layer (that is, cut to expose a cut surface obtained by cutting the α-$Al_2O_3$ layer along a plane including a normal line to the surface of the α-$Al_2O_3$ layer). Thereafter, the cut surface is polished with water resistant sandpaper (which contains an SiC grain abrasive as an abrasive).

The α-$Al_2O_3$ layer is cut, for example, in such a manner that the surface of α-$Al_2O_3$ layer 16 (when another layer is formed on α-$Al_2O_3$ layer 16, a surface of the coating) is fixed with the use of wax or the like as being in intimate contact to a sufficiently large flat plate for holding, and thereafter the α-$Al_2O_3$ layer is cut in a direction perpendicular to the flat plate with a cutter with a rotary blade (cut such that the rotary blade and the flat plate are as perpendicular as possible to each other). Any portion of α-$Al_2O_3$ layer 16 can be cut so long as the α-$Al_2O_3$ layer is cut in such a perpendicular direction, however, a portion in the vicinity of the cutting edge ridgeline portion is preferably cut as will be described later.

Polishing is performed successively with water resistant sandpaper #400, #800, and #1500 (the number (#) of the water resistant sandpaper means a difference in grain size of the abrasive, and a greater number indicates a smaller grain size of the abrasive).

In succession, the polished surface is further smoothened through ion milling treatment with the use of Ar ions. Conditions for ion milling treatment are as follows.

Acceleration voltage: 6 kV

Irradiation angle: 0° from a direction of normal to the surface of the α-$Al_2O_3$ layer (that is, a linear direction in parallel to a direction of thickness of the α-$Al_2O_3$ layer at the cut surface)

Irradiation time period: 6 hours

Then, a smoothened cross-section (mirrored surface) is observed with an FE-SEM with EBSD (a product name: "SU6600" manufactured by Hitachi High-Technologies Corporation), and the obtained observation image is subjected to EBSD analyses. Though a location of observation is not particularly limited, a portion in the vicinity of the cutting edge ridgeline portion is preferably observed in consideration of relation with cutting characteristics.

In EBSD analyses, data is successively collected by individually positioning focused electron beams onto each pixel. A normal line to a sample surface (a smoothened cross-section of the α-$Al_2O_3$ layer) is inclined by 70° with respect to incident beams, and analysis is conducted at 15 kV. In order to avoid a charging effect, a pressure of 10 Pa is applied. A high current mode is set in conformity with a diameter of an opening of 60 μm or 120 μm. Data is collected stepwise at 0.1 μm/step, for 500×300 points corresponding to a plane region of 50×30 μm on the cross-section.

Results of EBSD analyses are analyzed by using commercially available software (a trademark: "orientation Imaging microscopy Ver 6.2" manufactured by EDAX Inc.) and a color map is created. Specifically, a crystal orientation A of each crystal grain included in a cross-section of α-$Al_2O_3$ layer 16 is specified. Crystal orientation A of each crystal grain specified here is a plane orientation observed when each crystal grain which appears in the cross-section of α-$Al_2O_3$ layer 16 is two-dimensionally viewed in a direction of normal to the cross-section (a direction passing through the sheet surface in FIG. 4). A plane orientation of each crystal grain in the direction of normal to the surface of α-$Al_2O_3$ layer 16 is then specified based on obtained crystal orientation A of each crystal grain. Then, a color map is created based on the specified plane orientation. The technique according to "Crystal Direction MAP" included in the software can be used for creating a color map. The color map is created over the entire region of α-$Al_2O_3$ layer 16 observed in the cut surface.

In FIG. 4, each hatched region surrounded by a solid line represents a (001) plane orientation crystal grain, and each region surrounded by a solid line and not hatched represents a crystal grain of which direction of normal to the (001) plane is in a direction other than the former. Namely, in FIG. 4, crystal grains of which plane orientation in the direction of normal to the surface of α-Al$_2$O$_3$ layer 16 is the (001) plane and a surface displaced from the (001) plane by 10° or smaller are hatched, and crystal grains of which plane orientation in the direction of normal to the surface of α-Al$_2$O$_3$ layer 16 is a surface other than the former are not hatched. A region shown in black in FIG. 4 is regarded as a region of crystal grains of which crystal orientation has not been specified with the method above.

In FIG. 4, a linear dimension (a shortest distance) d$_1$ from a virtual straight line S1 toward the base material of α-Al$_2$O$_3$ layer 16 is 2 μm, which is a thickness of upper layer portion 16A. In FIG. 4, a linear dimension (a shortest distance) d$_2$ from a virtual straight line S2 toward the surface of α-Al$_2$O$_3$ layer 16 is 1 μm, which is a thickness of lower layer portion 16B. Namely, a region of α-Al$_2$O$_3$ layer 16 extending inward by 2 μm from the surface located on the surface side is defined as upper layer portion 16A, and a region of α-Al$_2$O$_3$ layer 16 extending inward by 1 μm from the surface located on the base material side is defined as lower layer portion 16B. Virtual straight lines S1 and S2 are straight lines approximate to respective edges defined by the surfaces of α-Al$_2$O$_3$ layer 16.

In the color map, in upper layer portion 16A, a ratio of a total of areas of (001) plane orientation crystal grains to the area of the entire upper layer portion 16A is not lower than 90%, and in lower layer portion 16B, a ratio of a total of areas of (001) plane orientation crystal grains to the area of the entire lower layer 16B is not higher than 50%.

Tool 10 including α-Al$_2$O$_3$ layer 16 satisfying the requirement above is excellent in mechanical characteristics and longer in life, which will be described in comparison to the conventional art.

Approaches which have conventionally been taken in order to improve mechanical characteristics of an α-Al$_2$O$_3$ layer have aimed to improve characteristics of the α-Al$_2$O$_3$ layer and thereby improve characteristics of a coating having the α-Al$_2$O$_3$ layer by controlling a property of each crystal at the surface of the α-Al$_2$O$_3$ layer. Such conventional approaches are based on a concept that it is the surface of the α-Al$_2$O$_3$ layer that mostly receives load applied in a cutting process and that characteristics of the entire α-Al$_2$O$_3$ layer are controlled by controlling characteristics of this portion. Therefore, no attention has been paid to a construction of the Al$_2$O$_3$ layer in a direction of thickness. In particular, attention to the direction of thickness has not been paid owing to the fact that enhancement in uniformity of a layer fabricated with chemical vapor deposition (CVD) or physical vapor deposition (PVD) has been considered as favorable.

The present inventors, however, have assumed that a breakthrough in extension of life of a cutting tool will not be achieved simply with conventional approaches. Then, the present inventors have conducted various studies with attention being paid to a property of each crystal in a direction of thickness of the α-Al$_2$O$_3$ layer and have found that the property of crystals located on the base material side among crystals forming the α-Al$_2$O$_3$ layer significantly contributes to adhesion, that is, resistance to breakage, of the α-Al$_2$O$_3$ layer.

With further studies based on the finding above, the present inventors have found that a hardness of the α-Al$_2$O$_3$ layer itself tends to be higher with increase in area ratio of (001) plane orientation crystal grains in the layer whereas too large an area occupied by (001) plane orientation crystal grains tends to lower adhesion between the α-Al$_2$O$_3$ layer and another layer and that adhesion conversely tends to be high with variation in orientation of crystal grains in the α-Al$_2$O$_3$ layer.

Tool 10 according to the present embodiment was completed based on the finding above, and the tool includes coating 12 having α-Al$_2$O$_3$ layer 16 of which crystal structure is specifically varied in a direction of thickness. Specifically, α-Al$_2$O$_3$ layer 16 has upper layer portion 16A having a thickness of 2 μm, in which an area occupied by (001) plane orientation crystal grains is not lower than 90% and lower layer portion 16B having a thickness of 1 μm, in which an area occupied by (001) plane orientation crystal grains is not higher than 50%.

According to such an α-Al$_2$O$_3$ layer 16, in upper layer portion 16A which is a region where a crack is likely to occur during a cutting process, occurrence of a crack due to impact applied during the cutting process can be suppressed, toughness of the cutting tool can significantly be improved, and hence high resistance to wear can be achieved. High adhesion to a layer in contact with lower layer portion 16B can be achieved. Therefore, since coating 12 according to the present embodiment is excellent in both characteristics of resistance to wear and resistance to breakage, tool 10 achieves improved mechanical characteristics as compared with the conventional example and is longer in life.

In the present embodiment described above, the above-described area ratio in upper layer portion 16A is more preferably not lower than 92%. An upper limit value for the area ratio in upper layer portion 16A is not particularly limited, and it may be set, for example, to 100%. The above-described area ratio in lower layer portion 16B is more preferably not higher than 45%. A lower limit value for the area ratio in lower layer portion 16B is not particularly limited, and it may be set, for example, to 0%.

[Thickness of α-Al$_2$O$_3$ Layer]

Alpha-Al$_2$O$_3$ layer 16 in the present embodiment has a thickness preferably from 3 to 25 μm. The excellent effect as above can thus be exhibited. The thickness is more preferably from 3 to 22 μm and further preferably from 3 to 10 μm.

When α-Al$_2$O$_3$ layer 16 has a thickness smaller than 3 μm, an extent of improvement in resistance to wear owing to presence of α-Al$_2$O$_3$ layer 16 tends to be low. When the thickness exceeds 25 μm, interface stress attributed to a difference in coefficient of linear expansion between α-Al$_2$O$_3$ layer 16 and another layer increases and crystal grains of α-Al$_2$O$_3$ may come off. Therefore, when α-Al$_2$O$_3$ layer 16 has an intermediate layer portion between upper layer portion 16A and lower layer portion 16B, the intermediate layer portion preferably has a thickness not greater than 22 μm. Such a thickness can be determined by observing a vertical cross-section of base material 11 and coating 12 with a scanning electron microscope (SEM).

In the intermediate layer portion, a ratio of oriented crystal grains in the color map is preferably 50% or higher. In this case, lowering in hardness of α-Al$_2$O$_3$ layer 16 attributed to presence of an intermediate portion can be suppressed. The above-described ratio in the intermediate layer portion is more preferably not lower than 90% and further preferably not lower than 92%.

[Stress Distribution in α-Al$_2$O$_3$ Layer]

Preferably, α-Al$_2$O$_3$ layer 16 in the present embodiment has a stress distribution varying in a direction of thickness, with a side of upper surface 16a (that is, the surface side) of α-Al$_2$O$_3$ layer 16 having a compressive residual stress and a side of lower surface 16b (that is, the base material side)

of α-Al$_2$O$_3$ layer 16 having a tensile residual stress. Such an α-Al$_2$O$_3$ layer 16 can have a higher hardness on the side of upper surface 16a to which impact is directly applied during a cutting process, and can have higher adhesion on the side of lower surface 16b highly involved with adhesion of α-Al$_2$O$_3$ layer 16. This is because a hardness of a layer tends to be high with a compressive residual stress on the side of upper surface 16a, and a difference in stress between α-Al$_2$O$_3$ layer 16 on the side of lower surface 16b and base material 11 tends to be small with a tensile residual stress on the side of lower surface 16b.

The "compressive residual stress" and the "tensile residual stress" here refer to one type of internal stress (intrinsic strain) present in a layer. The compressive residual stress refers to a stress expressed by a "−" (minus) numeric value (a unit thereof being "MPa" herein). Therefore, a concept of a large compressive residual stress means that an absolute value of a numeric value is great, and a concept of a small compressive residual stress means that an absolute value of a numeric value is small.

The tensile residual stress refers to a stress expressed by a "+" (plus) numeric value (a unit thereof being "MPa" herein). Therefore, a concept of a large tensile residual stress means increase in such a numeric value, and a concept of a small tensile residual stress means decrease in such a numeric value. A stress distribution in α-Al$_2$O$_3$ layer 16 can be determined with the conventionally known $\sin^2\psi$ method and constant penetration depth method which use X-rays.

Figure 5:
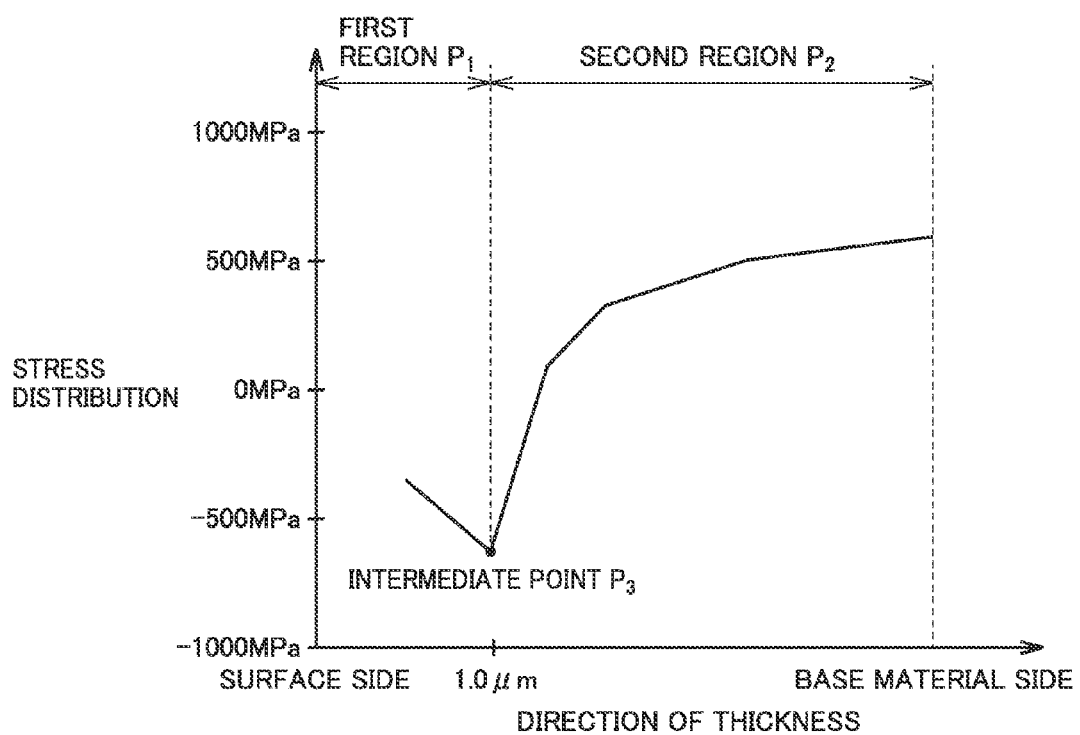
FIG. 5 is a graph schematically showing a stress distribution in a direction of thickness of the $\alpha$-$Al_2O_3$ layer.

FIG. 5 shows one example of a preferred distribution of stress. In the graph in FIG. 5, the ordinate represents a residual stress and the abscissa represents a position in the direction of thickness of α-Al$_2$O$_3$ layer 16. A "−" value on the ordinate means that a compressive residual stress is present in α-Al$_2$O$_3$ layer 16, a "+" value means that a tensile residual stress is present in α-Al$_2$O$_3$ layer 16, and a value "0" means that there is no stress in α-Al$_2$O$_3$ layer 16.

Referring to FIGS. 4 and 5, preferably, the stress distribution in the direction of thickness in α-Al$_2$O$_3$ layer 16 has a first region P$_1$ where an absolute value of the compressive residual stress continuously increases from the side of upper surface 16a (the surface side) toward lower surface 16b (the base material) and a second region P$_2$ located on the side of lower surface 16b relative to the first region, where an absolute value of the compressive residual stress continuously decreases and is turned to the tensile residual stress and successively an absolute value of the tensile residual stress continuously increases from the side of upper surface 16a toward lower surface 16b, and the first region and the second region are continuous, with an intermediate point P$_3$ where the absolute value of the compressive residual stress is greatest being interposed. Intermediate point P$_3$ is located closer to upper surface 16a than to lower surface 16b.

With the stress distribution in α-Al$_2$O$_3$ layer 16 as described above, balance between resistance to wear and resistance to breakage of α-Al$_2$O$_3$ layer 16 during intermittent cutting is better, because impact applied from the side of upper surface 16a of α-Al$_2$O$_3$ layer 16 to α-Al$_2$O$_3$ layer 16 is sufficiently absorbed in a portion between upper surface 16a and intermediate point P$_3$ and high adhesion is exhibited on the side of lower surface 16b relative to intermediate point P$_3$.

In particular, in α-Al$_2$O$_3$ layer 16 in the present embodiment, upper layer portion 16A located on the side of upper surface 16a is high in orientation with respect to the (001) plane, with an area occupied by oriented crystal grains being not lower than 90%. With such a portion having a high compressive residual stress, both characteristics of resistance to wear and toughness tend to be excellent. Lower layer portion 16B located on the side of lower surface 16b is low in orientation with respect to the (001) plane, with an area occupied by oriented crystal grains being not higher than 50%. With such a portion having a tensile residual stress, adhesion to a layer with which the portion is in contact tends to further improve.

In the stress distribution, preferably, an absolute value of the compressive residual stress is not higher than 1000 MPa (that is, not lower than −1000 MPa and lower than 0 MPa) and an absolute value of the tensile residual stress is not higher than 2000 MPa (that is, higher than 0 MPa and not higher than 2000 MPa). In this case, both characteristics of resistance to wear and resistance to breakage tend to appropriately be exhibited.

In the stress distribution, preferably, a region extending from upper surface 16a to a position at a distance (linear dimension) of 5 to 50% of a thickness of α-Al$_2$O$_3$ layer 16 has a compressive residual stress and a region other than that has a tensile residual stress. In this case as well, balance between resistance to wear and resistance to breakage is particularly good. The distance is more preferably set to 5 to 45% and further preferably to 10 to 40%.

Intermediate point P$_3$ is preferably located at a distance from upper surface 16a of 0.1 to 40% of a thickness of α-Al$_2$O$_3$ layer 16. In this case, a form of damage to α-Al$_2$O$_3$ layer 16 is stable, and for example, sudden breakage can be suppressed and hence variation in life of tool 10 can be lessened. For example, when α-Al$_2$O$_3$ layer 16 has a thickness from 3 to 10 μm, a distance of intermediate point P$_3$ from upper surface 16a is preferably from 0.5 to 2 μm. An absolute value of the compressive residual stress at intermediate point P$_3$ is preferably from 100 to 900 MPa, more preferably from 200 to 890 MPa, and further preferably from 350 to 890 MPa.

[First Intermediate Layer]

Referring back to FIG. 3, coating 12 according to the present embodiment has a TiCN layer as first intermediate layer 14 between base material 11 and α-Al$_2$O$_3$ layer 16. Since the TiCN layer is excellent in resistance to wear, resistance to wear of coating 12 can thus further be improved.

[Second Intermediate Layer]

Figure 3:
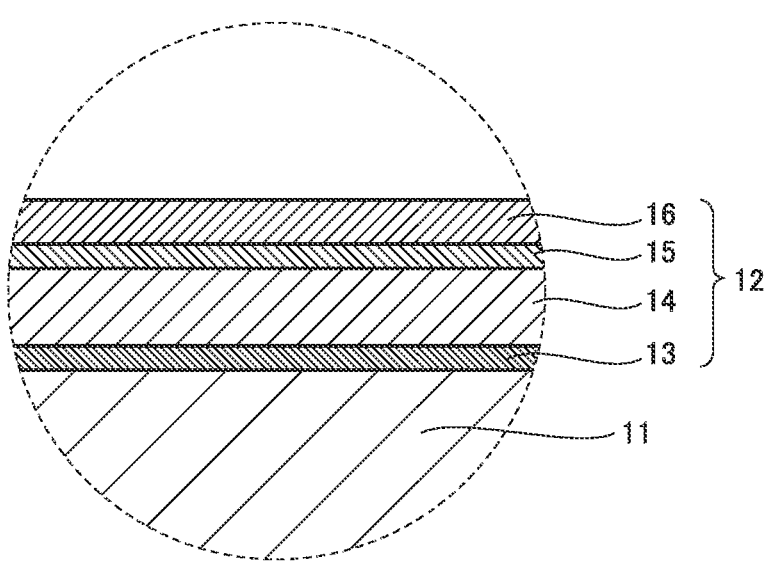
FIG. 3 is a partially enlarged view of FIG. 2.
Figure 4:
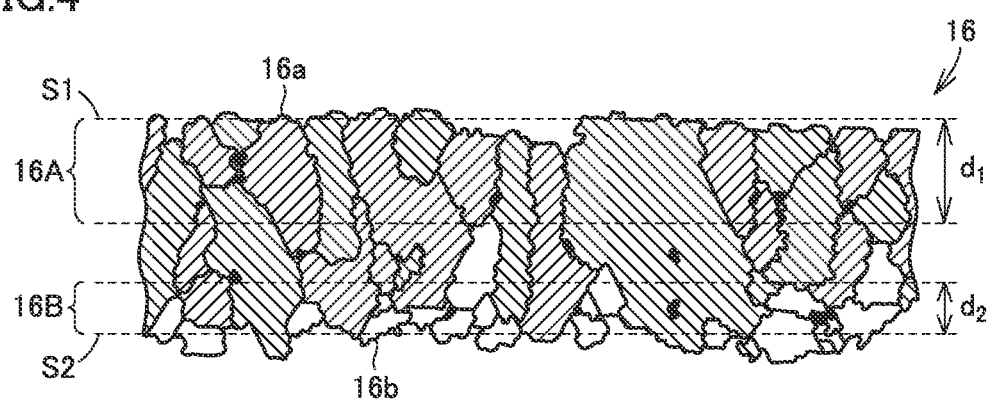
FIG. 4 shows a color map created based on a cross-section of an $\alpha$-$Al_2O_3$ layer obtained when a coating is cut along a plane including a normal line to a surface of the coating.
Figure 6:
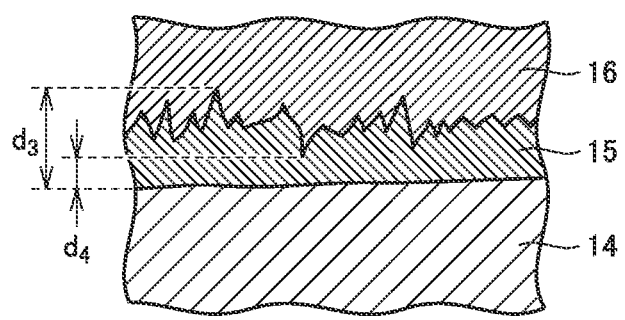
FIG. 6 is a cross-sectional view schematically showing a shape of a second intermediate layer in a direction of thickness.

Referring to FIG. 3, coating 12 according to the present embodiment has second intermediate layer 15 between first intermediate layer 14 and α-Al$_2$O$_3$ layer 16. As shown in FIG. 6, second intermediate layer 15 is preferably formed of needle crystals.

The needle crystals refer to crystals having an elongated shape like a needle because its direction of crystal growth extends in one direction. A layer formed of needle crystals is characterized by a significantly varied thickness thereof and a complicated surface shape as shown in FIG. 6, and hence it can exhibit an effect as an anchor to a layer with which it is in contact. Therefore, with second intermediate layer 15 between base material 11 and α-Al$_2$O$_3$ layer 16, α-Al$_2$O$_3$ layer 16 is less likely to peel off from base material 11 and hence resistance to breakage of tool 10 including coating 12 is further enhanced.

Second intermediate layer 15 is preferably formed from a TiCNO layer or a TiBN layer because TiCNO and TiBN are more likely to form needle crystals. A difference between a greatest thickness d$_3$ and a smallest thickness d$_4$ of second intermediate layer 15 is preferably not smaller than 0.3 μm. In this case, the characteristics above are effectively exhibited. The difference is preferably not greater than 1.0 μm. When the difference exceeds 1.0 μm, a shape of second intermediate layer 15 may adversely affect a shape of coating 12. The difference can be determined with an FE-SEM with EBSD.

[Underlying Layer]

Referring to FIG. 3, coating 12 according to the present embodiment has underlying layer 13 in contact with base material 11. Adhesion between base material 11 and coating 12 can further be enhanced by employing, for example, a TiN layer as underlying layer 13.

[Other Layers]

Coating 12 according to the present embodiment may have a surface layer on α-$Al_2O_3$ layer 16. The surface layer is preferably formed from a TiC layer, a TiN layer, or a $TiB_2$ layer. Though the side of upper surface 16a of α-$Al_2O_3$ layer 16 is highly oriented in line with the (001) plane, the TiC layer, the TiN layer, and the $TiB_2$ layer formed on such an α-$Al_2O_3$ layer 16 are particularly effective in suppression of propagation of a crack during intermittent cutting. Therefore, coating 12 having a surface layer of such a composition is advantageous in improvement in toughness. Among these, the TiN layer exhibits a clear gold color, and therefore identification of a cutting edge after use for cutting is easy, which is advantageous in terms of cost efficiency.

[Manufacturing Method]

Tool 10 according to the present embodiment described above can be manufactured by fabricating coating 12 on a surface of base material 11. Coating 12 can be formed with chemical vapor deposition (CVD) with the use of a CVD apparatus illustrated in FIG. 7.

Figure 7:
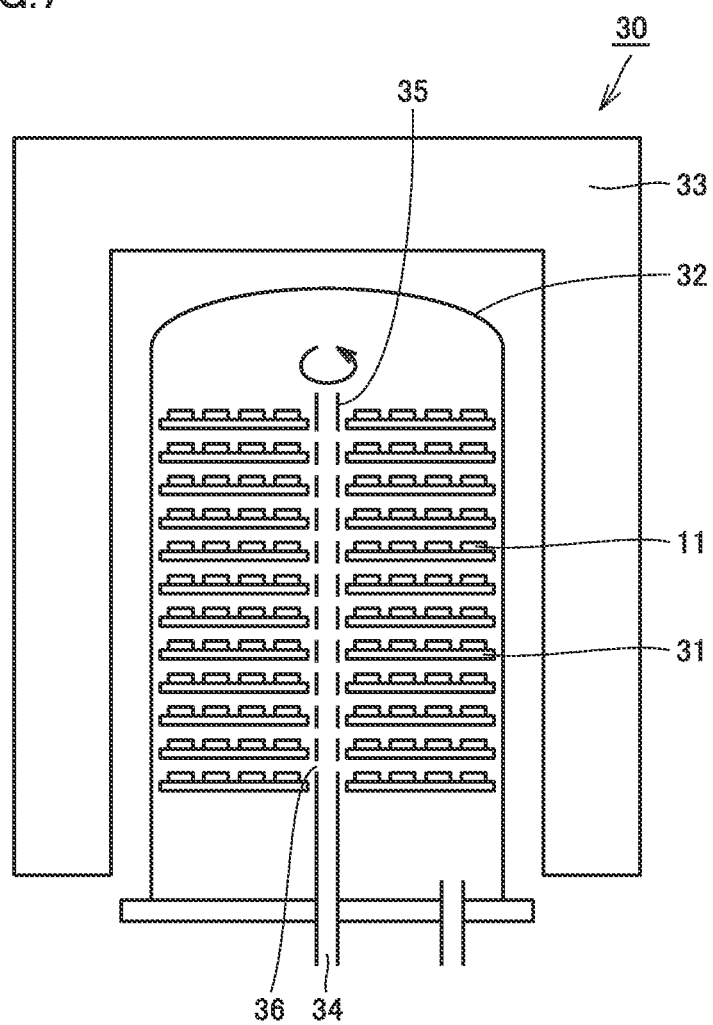
FIG. 7 is a cross-sectional view schematically showing one example of a chemical vapor deposition apparatus used for manufacturing a coating according to an embodiment.

Referring to FIG. 7, a CVD apparatus 30 includes a plurality of base material setting jigs 31 for holding base materials 11 and a reaction vessel 32 made of heat resistant alloy steel, which covers base material setting jigs 31. A thermostat 33 for controlling a temperature in reaction vessel 32 is provided around reaction vessel 32. A gas introduction pipe 35 having a gas inlet port 34 is provided in reaction vessel 32. Gas introduction pipe 35 is arranged to extend in a vertical direction in an internal space in reaction vessel 32 where base material setting jigs 31 are arranged, and provided with a plurality of injection holes 36 for injecting a gas into reaction vessel 32. Each layer can be formed as follows, with the use of this CVD apparatus 30.

Initially, base material 11 is arranged on base material setting jig 31, and a source gas for underlying layer 13 is introduced from gas introduction pipe 35 into reaction vessel 32 while a temperature and a pressure in reaction vessel 32 are controlled within a prescribed range. Underlying layer 13 is thus fabricated on the surface of base material 11. Similarly, first intermediate layer 14 and second intermediate layer 15 are successively formed on underlying layer 13 by successively introducing a source gas for first intermediate layer 14 and a source gas for second intermediate layer 15 into reaction vessel 32.

For example, in manufacturing a TiN layer, $TiCl_4$ and $N_2$ can be employed as source gases. In manufacturing a TiCN layer, $TiCl_4$, $N_2$, and $CH_3CN$ can be employed. In manufacturing a TiCNO layer, $TiCl_4$, $N_2$, CO, and $CH_4$ can be employed.

A temperature in reaction vessel 32 in forming each layer is preferably controlled to 1000 to 1100° C., and a pressure in reaction vessel 32 is preferably controlled to 0.1 to 1013 hPa. HCl may be introduced together with a source gas. With introduction of HCl, uniformity in thickness of the layers can be improved. $H_2$ is preferably employed as a carrier gas. During introduction of gases, gas introduction pipe 35 is preferably rotated by a not-shown drive portion. Each gas can thus uniformly be distributed in reaction vessel 32.

At least one of the layers may be formed with medium temperature (MT)-CVD. Unlike CVD performed at a temperature from 1000° C. to 1100° C. (hereinafter also referred to as "HT-CVD"), MT-CVD is a method of forming a layer with a temperature in reaction vessel 32 being maintained at a relatively mild temperature from 850 to 950° C. Since MT-CVD is performed at a temperature relatively lower than that in HT-CVD, damage to base material 11 by heating can be lessened. In particular, a TiCN layer is preferably formed with MT-CVD.

Then, α-$Al_2O_3$ layer 16 is formed on second intermediate layer 15. Alpha-$Al_2O_3$ layer 16 according to the present embodiment can be formed with CVD including a first α-$Al_2O_3$ formation step and a second α-$Al_2O_3$ formation step below. In particular, α-$Al_2O_3$ layer 16 having the stress distribution described above can be formed by further performing a compressive residual stress providing step. The first α-$Al_2O_3$ formation step, the second α-$Al_2O_3$ formation step, and the compressive residual stress providing step will sequentially be described below.

Firstly, the first α-$Al_2O_3$ formation step is performed. $AlCl_3$, $N_2$, $CO_2$, and $H_2S$ are employed as source gases. Here, a ratio between flow rates as satisfying $CO_2/H_2S \geq 2$ is set for flow rates (l/min.) of $CO_2$ and $H_2S$. Lower layer portion 16B having the orientation described above is thus formed. Preferred flow rates of $CO_2$ and $H_2S$ are 0.4 to 2.0 l/min. and 0.1 to 0.8 l/min. and most preferably 1 l/min. and 0.5 l/min., respectively. Though an upper limit value for $CO_2/H_2S$ is not particularly restricted, the upper limit value not greater than 5 is preferred from a point of view of uniformity in thickness of the layer.

In the first α-$Al_2O_3$ formation step, a duration of film formation is controlled so as to form an α-$Al_2O_3$ layer having a thickness of at least 1 μm, because a lowermost (a side in contact with second intermediate layer 15 being defined as a lower side) α-$Al_2O_3$ layer in the α-$Al_2O_3$ layer formed in the first α-$Al_2O_3$ formation step serves as lower layer portion 16B. Therefore, a duration of film formation in the first α-$Al_2O_3$ formation step is set to 5 minutes or longer. When a duration of film formation is excessively long, a thick layer relatively low in hardness is formed, which is not preferred in terms of a hardness of coating 12. Therefore, a duration of film formation in the first α-$Al_2O_3$ formation step is set to 30 minutes or shorter.

When an α-$Al_2O_3$ layer having a thickness exceeding 1 μm is formed in the first α-$Al_2O_3$ formation step, a lowermost layer having a thickness of 1 μm is regarded as lower layer portion 16B and a portion other than that is regarded as an intermediate layer portion (a first intermediate layer portion).

Secondly, the second α-$Al_2O_3$ formation step is performed. $AlCl_3$, $N_2$, $CO_2$, and $H_2S$ are employed as source gases. Here, a ratio between flow rates as satisfying $0.5 \leq CO_2/H_2S \leq 1$ is set for flow rates (l/min.) of a $CO_2$ gas and an $H_2S$ gas. Upper layer portion 16A having the orientation described above is thus formed.

In the second α-$Al_2O_3$ formation step, a duration of film formation is controlled so as to form an α-$Al_2O_3$ layer having a thickness of at least 2 μm, because an uppermost (a side where a surface of coating 12 is formed being defined as an upper side) α-$Al_2O_3$ layer in the α-$Al_2O_3$ layer formed in the second α-$Al_2O_3$ formation step serves as upper layer portion 16A. Therefore, a duration of film formation in the second α-$Al_2O_3$ formation step is set to 30 minutes or longer. Though an upper limit value for the duration of film formation is not particularly restricted, an excessive thickness of α-$Al_2O_3$ layer 16 leads to concern about fall-off of crystal grains. Therefore, the duration of film formation in the second $\alpha$-$Al_2O_3$ formation step is preferably not longer than 500 minutes.

When an $\alpha$-$Al_2O_3$ layer having a thickness exceeding 2 μm is formed in the second $\alpha$-$Al_2O_3$ formation step, an uppermost layer having a thickness of 2 μm is regarded as upper layer portion 16A and a portion other than that is regarded as an intermediate layer portion (a second intermediate layer portion).

In the first $\alpha$-$Al_2O_3$ formation step and the second $\alpha$-$Al_2O_3$ formation step, a temperature in reaction vessel 32 is controlled preferably to 1000 to 1100° C. and a pressure in reaction vessel 32 is controlled preferably to 0.1 to 100 hPa. HCl may be introduced together with the source gases listed above and $H_2$ can be employed as a carrier gas. During introduction of gases, gas introduction pipe 35 is rotated, which is similarly preferable as above.

Thirdly, formed $\alpha$-$Al_2O_3$ layer 16 is subjected to blast treatment from the surface side (the side of upper surface 16a) to thereby provide a compressive residual stress to $\alpha$-$Al_2O_3$ layer 16 (the compressive residual stress providing step). Though a layer formed with CVD tends to generally have a tensile residual stress, a compressive residual stress can be provided to the surface side of $\alpha$-$Al_2O_3$ layer 16 in the present step so that $\alpha$-$Al_2O_3$ layer 16 having the stress distribution described above can be fabricated.

By controlling a projection pressure, a time period for projection, and a distance of projection of media in the blast treatment, presence and a position (a distance from upper surface 16a) of intermediate point $P_3$ in the stress distribution can be controlled. A region having a compressive residual stress can be controlled by controlling a time period for projection, and hence a compressive residual stress can be provided to a desired region in the direction of thickness of $Al_2O_3$ layer 16 from upper surface 16a.

When coating 12 has a surface layer formed on upper surface 16a of $\alpha$-$Al_2O_3$ layer 16, the compressive residual stress providing step is preferably performed after the surface layer is formed, because, in order to form a surface layer after the compressive residual stress providing step, CVD apparatus 30 should be turned off and base material 11 should be taken out of reaction vessel 32, which makes a manufacturing process complicated. Since this surface layer should only remain on a part of the surface of tool 10, the surface layer may partially be removed in blast treatment.

With the manufacturing method described above, coating 12 can be manufactured and hence tool 10 including coating 12 can be manufactured.

When an area ratio of (001) plane orientation crystal grains is high also on the base material side of the $\alpha$-$Al_2O_3$ layer, a composition or the like of a layer in contact with the surface of the $\alpha$-$Al_2O_3$ layer on the base material side tends to be restricted. When the layer in contact is polycrystalline, it may be difficult to form a highly oriented $\alpha$-$Al_2O_3$ layer on that layer. In contrast, since $\alpha$-$Al_2O_3$ layer 16 in the present embodiment has lower layer portion 16B in which an area ratio of (001) plane orientation crystal grains is not higher than 50%, it is free from restriction described above.

By controlling each condition for CVD in the manufacturing method, a property of each layer varies. For example, a composition of each layer is determined by a composition of a source gas introduced in reaction vessel 32, and a thickness of each layer is controlled by a duration of a process (a duration of film formation). Second intermediate layer 15 is preferably made of needle crystals, and a shape of a crystal can be like a needle by controlling a flow rate of a source gas and a temperature for film formation. Lengths of needle crystals can be made non-uniform by controlling a pressure during formation, so that a difference between greatest thickness $d_3$ and smallest thickness $d_4$ as described above can be produced. In particular, in $\alpha$-$Al_2O_3$ layer 16, an orientation of a crystal in a direction of thickness can be varied by controlling a ratio of a flow rate ($CO_2/H_2S$) between a $CO_2$ gas and an $H_2S$ gas of the source gases.

EXAMPLES

Though the present invention will be described in further detail below with reference to Examples, the present invention is not limited thereto. Samples Nos. 1 to 12 correspond to Examples and samples Nos. 13 to 20 represent Comparative Examples.

[Fabrication of Sample]

Fabrication of sample No. 1 will initially be described. A chip made of cemented carbide (shape: CNMG120408N-UX manufactured by Sumitomo Electric Hardmetal Corporation, JIS B4120 (2013)) composed of TaC (2.0 mass %), NbC (1.0 mass %), Co (10.0 mass %), and WC (remainder) (and containing an inevitable impurity) was prepared as a base material. A coating was fabricated on the surface of the base material by successively forming an underlying layer, a first intermediate layer, a second intermediate layer, an $\alpha$-$Al_2O_3$ layer, and a surface layer on the prepared base material with the use of a CVD apparatus. Conditions for forming each layer are shown below. A flow rate (l/min.) of each gas is shown in parentheses following a composition of each gas.

(Underlying Layer: TiN Layer)
Gas: $TiCl_4$ (5), $N_2$ (15), $H_2$ (45)
Pressure and Temperature: 130 hPa and 900° C.
(First Intermediate Layer: TiCN Layer)
Gas: $TiCl_4$ (10), $N_2$ (15), $CH_3CN$ (1.0), $H_2$ (85)
Pressure and Temperature: 90 hPa and 860° C. (MT-CVD)
(Second Intermediate Layer: TiCNO Layer)
Gas: $TiCl_4$ (0.003), $CH_4$ (2.2), $N_2$ (6.7), CO (0.5), HCl (1.5), $H_2$ (40)
Pressure and Temperature: 180 hPa and 1010° C.
($\alpha$-$Al_2O_3$ Layer)
(1) Conditions for CVD in First $\alpha$-$Al_2O_3$ Formation Step
Gas: $AlCl_3$ (2.5), $CO_2$ (1.3), $H_2S$ (0.4), $H_2$ (40)
Pressure and Temperature: 80 hPa and 1000° C.
(2) Conditions for CVD in Second $\alpha$-$Al_2O_3$ Formation Step
Gas: $AlCl_3$ (3), $CO_2$ (1.0), $H_2S$ (1.4), $H_2$ (38)
Pressure and Temperature: 80 hPa and 1000° C.
(Surface Layer: $TiB_2$ Layer)
Gas: $TiCl_4$ (9), $BCl_3$ (1.0), HCl (0.6), $H_2$ (30)
Pressure and Temperature: 70 hPa and 1000° C.

Then, a throwaway chip for turning representing a base material having a coating formed was subjected to blast treatment below. Balls made of aluminum oxide having an average particle size of 50 μm were caused to collide evenly with a rake face and a flank face for 5 seconds with compressed air (projection pressure) at 0.15 MPa in a direction at 45° with respect to the cutting edge ridgeline portion while the chip was rotated at 100 rpm.

A tool according to sample No. 1 was fabricated as above. Each tool according to each of samples Nos. 2 to 20 was also fabricated by forming a coating constituted of an underlying layer, a first intermediate layer, a second intermediate layer, an $\alpha$-$Al_2O_3$ layer, and a surface layer on the similar base material. In each sample, a composition of the second intermediate layer and the surface layer was varied as appropriate by varying a source gas used for forming the second intermediate layer and the surface layer. Table 1 shows a composition and a thickness of each layer forming the coating in each sample. A thickness of each layer was adjusted by adjusting as appropriate a duration of film formation.

TABLE 1

| | Composition/Thickness (μm) | | | | |
|---|---|---|---|---|---|
| | Underlying Layer | First Intermediate Layer | Second Intermediate Layer | α-Al$_2$O$_3$ Layer | Surface Layer |
| No. 1 | 0.4 | 6.5 | TiCNO/0.7 | 4.0 | TiB$_2$/0.7 |
| No. 2 | 0.4 | 4.5 | TiBN/0.5 | 3.0 | TiN/0.5 |
| No. 3 | 0.4 | 5 | TiCNO/0.5 | 10 | TiC/0.5 |
| No. 4 | 0.4 | 7.5 | TiBN/0.3 | 13 | TiN/0.8 |
| No. 5 | 0.4 | 8 | TiCNO/0.5 | 17 | TiB$_2$/0.5 |
| No. 6 | 0.4 | 6.5 | TiBN/0.5 | 22 | TiN/0.7 |
| No. 7 | 0.4 | 6.5 | TiCNO/0.7 | 4.0 | — |
| No. 8 | 0.4 | 4.5 | TiCNO/0.5 | 4.5 | — |
| No. 9 | 0.4 | 8 | TiCNO/0.8 | 5.0 | TiC/0.5 |
| No. 10 | 0.4 | 7 | TiBN/0.5 | 3.5 | TiB$_2$/0.3 |
| No. 11 | 0.4 | 4.5 | TiCNO/0.4 | 3.5 | TiC/0.5 |
| No. 12 | 0.4 | 5 | TiCNO/0.5 | 7.0 | TiB$_2$/0.5 |
| No. 13 | 0.4 | 6.5 | TiCNO/0.5 | 4.0 | TiN/0.5 |
| No. 14 | 0.4 | 5.5 | TiBN/0.3 | 3.0 | TiB$_2$/0.5 |
| No. 15 | 0.4 | 7.3 | TiCNO/0.5 | 3.0 | — |
| No. 16 | 0.4 | 8.8 | TiBN/0.3 | 4.5 | TiN/0.3 |
| No. 17 | 0.4 | 5.5 | TiCNO/0.8 | 8.5 | TiC/0.3 |
| No. 18 | 0.4 | 6.5 | TiCNO/0.3 | 3.0 | TiC/0.3 |
| No. 19 | 0.4 | 7 | TiBN/0.5 | 4.0 | TiB$_2$/0.5 |
| No. 20 | 0.4 | 5.5 | TiBN/0.5 | 4.0 | TiC/0.5 |

For the second intermediate layer and the α-Al$_2$O$_3$ layer, conditions other than the source gas and the duration of film formation were also varied as appropriate. Specifically, a pressure during film formation was varied for the second intermediate layer as shown in Table 2. Thus, a difference between a greatest thickness and a smallest thickness of the second intermediate layer formed of needle crystals in each sample was different as shown in Table 2.

TABLE 2

| Second Intermediate Layer | Pressure During Film Formation (hPa) | Difference Between Greatest Thickness and Smallest Thickness (μm) |
|---|---|---|
| No. 1 | 180 | 0.5 |
| No. 2 | 200 | 0.7 |
| No. 3 | 210 | 0.8 |
| No. 4 | 180 | 0.5 |
| No. 5 | 180 | 0.5 |
| No. 6 | 180 | 0.5 |
| No. 7 | 180 | 0.5 |
| No. 8 | 210 | 0.8 |
| No. 9 | 210 | 0.8 |
| No. 10 | 210 | 0.8 |
| No. 11 | 130 | 0.2 |
| No. 12 | 250 | 1.3 |
| No. 13 | 80 | 0.1 |
| No. 14 | 150 | 0.3 |
| No. 15 | 80 | 0.1 |
| No. 16 | 80 | 0.1 |
| No. 17 | 150 | 0.3 |
| No. 18 | 180 | 0.5 |
| No. 19 | 180 | 0.5 |
| No. 20 | 180 | 0.5 |

For the α-Al$_2$O$_3$ layer, a degree of orientation in the upper layer portion and the lower layer portion was controlled by varying a ratio of a flow rate (CO$_2$/H$_2$S) between CO$_2$ and H$_2$S of gases to be introduced as shown in Table 3. For all of samples Nos. 1 to 20, the first α-Al$_2$O$_3$ formation step was performed for 30 minutes and thereafter the second α-Al$_2$O$_3$ formation step was performed for a prescribed period of time. Then, area ratios (%) of (001) plane orientation crystal grains in the formed lower layer portion and upper layer portion were found with the method described above. Table 3 shows results. Fields of "first" and "second" in Table 3 show ratios of flow rates between CO$_2$ and H$_2$S during the first α-Al$_2$O$_3$ formation step and the second α-Al$_2$O$_3$ formation step, respectively.

TABLE 3

| | CVD Conditions Ratio of Flow Rate (CO$_2$/H$_2$S) | | Area Ratio (%) | |
|---|---|---|---|---|
| α-Al$_2$O$_3$ Layer | Second | First | Upper Layer Portion | Lower Layer Portion |
| No. 1 | 0.71 | 3.3 | 95 | 0 |
| No. 2 | 0.95 | 2.2 | 98 | 42 |
| No. 3 | 0.70 | 3.0 | 92 | 5 |
| No. 4 | 0.62 | 3.5 | 100 | 22 |
| No. 5 | 0.71 | 2.5 | 98 | 14 |
| No. 6 | 0.95 | 2.2 | 95 | 10 |
| No. 7 | 0.85 | 3.3 | 92 | 3 |
| No. 8 | 0.62 | 3.5 | 100 | 0 |
| No. 9 | 0.71 | 2.5 | 95 | 35 |
| No. 10 | 0.95 | 2.2 | 100 | 7 |
| No. 11 | 0.62 | 3.0 | 98 | 15 |
| No. 12 | 0.85 | 3.3 | 100 | 30 |
| No. 13 | 1.5 | 1.5 | 0 | 0 |
| No. 14 | 1.1 | 1.8 | 55 | 55 |
| No. 15 | 0.80 | 0.95 | 92 | 52 |
| No. 16 | 1.5 | 1.5 | 0 | 0 |
| No. 17 | 1.1 | 1.9 | 86 | 15 |
| No. 18 | 0.71 | 0.71 | 95 | 90 |
| No. 19 | 1.5 | 1.5 | 35 | 35 |
| No. 20 | 1.2 | 1.8 | 85 | 55 |

Referring to Table 3, in samples Nos. 1 to 12, in the color map created with the method described above, an area ratio of the (001) plane orientation crystal grains in the upper layer portion was not lower than 90% and an area ratio of the (001) plane orientation crystal grains in the lower layer portion was not higher than 50%.

None of samples Nos. 13 to 20 satisfied the condition that an area ratio of the (001) plane orientation crystal grains in the upper layer portion was not lower than 90% and an area ratio of the (001) plane orientation crystal grains in the lower layer portion was not higher than 50%.

In fabrication of samples 1 to 20, conditions for blast treatment were also varied. Table 4 shows conditions for the blast treatment for each sample. Residual stresses at arbitrary six points different in depth (a distance from the upper surface) in the direction of thickness of the α-Al$_2$O$_3$ layer were measured with the sin$^2$ψ method described above. Table 4 shows a residual stress at a position at a distance of 0.5 μm from the upper surface ("upper surface side" in Table 4) and a residual stress at a position at a distance of 0.5 μm from the lower surface ("lower surface side" in Table 4). Residual stresses at arbitrary three points at each depth were measured and an average value thereof was defined as a residual stress at each depth.

Whether or not first region P$_1$ and second region P$_2$ were present in each sample was determined based on a result of measurement of a residual stress, and it was determined that intermediate point P$_3$ was present in a sample in which first region P$_1$ and second region P$_2$ were confirmed. A ratio (%)

of a thickness of a region having a compressive residual stress to a thickness of the $Al_2O_3$ layer in the direction of thickness of the $\alpha$-$Al_2O_3$ layer was calculated based on the result of measurement. Table 4 shows these results.

TABLE 4

| $\alpha$-$Al_2O_3$ Layer | Blast Treatment Condition Projection Pressure (MPa) | Stress Distribution Upper Surface Side (MPa) | Stress Distribution Lower Surface Side (MPa) | Presence of Intermediate Point $P_3$ | Ratio of Thickness Having Compressive Residual Stress (%) |
|---|---|---|---|---|---|
| No. 1 | 0.15 | −350 | 600 | Yes | 35 |
| No. 2 | 0.18 | −450 | 350 | Yes | 25 |
| No. 3 | 0.15 | −890 | 1650 | Yes | 12 |
| No. 4 | 0.13 | −200 | 1530 | Yes | 8 |
| No. 5 | 0.13 | −300 | 1820 | Yes | 5 |
| No. 6 | 0.15 | −450 | 1950 | Yes | 45 |
| No. 7 | 0.15 | −400 | 530 | Yes | 30 |
| No. 8 | 0.15 | −740 | 1200 | Yes | 15 |
| No. 9 | 0.05 | −450 | 600 | No | 25 |
| No. 10 | 0.05 | −120 | 980 | No | 35 |
| No. 11 | 0.13 | −320 | 870 | Yes | 15 |
| No. 12 | 0.15 | −430 | 770 | Yes | 30 |
| No. 13 | — | 1700 | 1880 | No | — |
| No. 14 | — | 1290 | 1430 | No | — |
| No. 15 | — | 1320 | 1580 | No | — |
| No. 16 | — | 2100 | 2340 | No | — |
| No. 17 | 0.05 | −200 | 2120 | No | 8 |
| No. 18 | 0.15 | −350 | 600 | Yes | 25 |
| No. 19 | 0.18 | −300 | 980 | Yes | 30 |
| No. 20 | 0.13 | −400 | 750 | Yes | 20 |

Referring to Table 4, no intermediate point $P_3$ was present in samples Nos. 9, 10, and 17 because a projection pressure in blast treatment was lower. Namely, in samples Nos. 9, 10, and 17, such a stress distribution that a residual stress gradually varied from a compressive residual stress to a tensile residual stress from the upper surface side (the surface side) toward the lower surface (the base material) was observed. Since blast treatment was not performed for samples 13 to 16, the stress distribution described above was not observed in the $Al_2O_3$ layer and a tensile residual stress was merely present on both of the upper surface side and the lower surface side.

In samples Nos. 1 to 8, 11, 12, and 18 to 20 in which intermediate point $P_3$ was observed, a position thereof was at a distance of 0.5 μm from the surface of the $\alpha$-$Al_2O_3$ layer. Therefore, a value shown in a field of "upper surface side" in Table 4 represents a maximum value of a compressive residual stress in the $\alpha$-$Al_2O_3$ layer in each sample.

[Evaluation 1: Resistance to Breakage]

A chip according to each sample was set on a cutting tool of a model number PCLNR2525-43 (manufactured by Sumitomo Electric Industries, Ltd.) and resistance to breakage thereof in repeated turning of alloy steel was evaluated.

Conditions for cutting are as follows. Twenty chips for each sample were used for turning for 20 seconds, and a ratio (number) of chips which have failed among 20 chips in total was calculated as a ratio of failure (%). Table 5 shows results. A lower ratio of failure (%) in Table 5 indicates better resistance to breakage.

Work material: SCM440 (with 6 grooves, φ 350 mm)
Cutting speed: 120 m/min.
Depth of cutting: 2.0 mm
Coolant: not used

[Evaluation 2: Resistance to Wear]

A chip according to each sample was set on a cutting tool of a model number PCLNR2525-43 (manufactured by Sumitomo Electric Industries, Ltd.) and resistance to wear thereof in repeated turning of alloy steel was evaluated.

Conditions for turning are as follows. Twenty chips for each sample were used for turning for 15 minutes. An amount of wear Vb (mm) on a side of a flank face of 20 chips in total was measured and an average value for each sample was calculated. Table 5 shows results. A smaller value of Vb (mm) in Table 5 indicates better resistance to wear.

Work material: SCr420H (φ 250 mm)
Cutting speed: 280 m/min.
Depth of cutting: 2.0 mm
Feed rate: 0.2 mm/rev
Coolant: water-soluble oil

TABLE 5

| | Evaluation 1 Ratio of Failure (%) | Evaluation 2 Vb (mm) |
|---|---|---|
| No. 1 | 0 | 0.08 |
| No. 2 | 5 | 0.07 |
| No. 3 | 5 | 0.07 |
| No. 4 | 10 | 0.11 |
| No. 5 | 20 | 0.14 |
| No. 6 | 20 | 0.13 |
| No. 7 | 15 | 0.1 |
| No. 8 | 15 | 0.11 |
| No. 9 | 15 | 0.11 |
| No. 10 | 15 | 0.12 |
| No. 11 | 20 | 0.14 |
| No. 12 | 20 | 0.13 |
| No. 13 | 100 | 0.32 |
| No. 14 | 75 | 0.28 |
| No. 15 | 80 | 0.25 |
| No. 16 | 100 | 0.43 |
| No. 17 | 75 | 0.29 |
| No. 18 | 75 | 0.09 |
| No. 19 | 20 | 0.33 |
| No. 20 | 80 | 0.35 |

Referring to Table 5, in samples Nos. 1 to 12, higher resistance to breakage and higher resistance to wear than in samples Nos. 13 to 20 were confirmed. In samples Nos. 1 to 12, in the upper layer portion, an area ratio of (001) plane orientation crystal grains was not lower than 90%, and in the lower layer portion, an area ratio of (001) plane orientation crystal grains was not higher than 50%, whereas samples Nos. 13 to 20 did not satisfy those conditions. It was confirmed from these results that chips according to samples Nos. 1 to 12 representing one example of the present embodiment had high resistance to breakage and high resistance to wear, and hence excellent mechanical characteristics, and achieved stable long life.

Samples Nos. 13 and 16 were expected to be excellent in resistance to breakage, because an area ratio of (001) plane orientation crystal grains in the lower layer portion was not higher than 50%. In evaluation 1, however, a ratio of failure was 100%. This was not a failure from a point of view of peel-off of the $\alpha$-$Al_2O_3$ layer from the base material but a failure caused by destruction of the $\alpha$-$Al_2O_3$ layer itself, because there was no layer corresponding to the upper layer portion contributing to a hardness.

It should be understood that the embodiment disclosed herein is illustrative and non-restrictive in every respect. The scope of the present invention is defined by the terms of the claims, rather than the embodiment above, and is intended to include any modifications within the scope and meaning equivalent to the terms of the claims.

REFERENCE SIGNS LIST 1 rake face; 2 flank face; 3 cutting edge ridgeline portion; 10 surface-coated cutting tool; 11 base material; 11a rake face; 11b flank face; 11c cutting edge ridgeline portion; 12 coating; 13 underlying layer; 14 first intermediate layer; 15 second intermediate layer; 16 α-$Al_2O_3$ layer; 16a upper surface; 16b lower surface; 16A upper layer portion; 16B lower layer portion; 30 CVD apparatus; 31 base material setting jig; 32 reaction vessel; 33 thermostat; 34 gas inlet port; 35 gas introduction pipe; 36 through hole; $P_1$ first region; $P_2$ second region; and $P_3$ intermediate point.

The invention claimed is:
1. A surface-coated cutting tool, comprising:
a base material; and
a coating formed on the base material,
the coating including an α-$Al_2O_3$ layer containing a plurality of crystal grains of α-$Al_2O_3$,
the α-$Al_2O_3$ layer including a lower layer portion which is located on a base material side in a thickness direction and has a thickness of 1 μm and an upper layer portion which is located on a surface side opposite to the base material side and has a thickness of 2 μm,
when respective crystal orientations of the crystal grains are specified by performing electron beam backscattering diffraction analyses with a field emission-type scanning microscope, on a cross section obtained when the α-$Al_2O_3$ layer is cut along a plane including a normal line of a surface of the α-$Al_2O_3$ layer and a color map is prepared based on the crystal orientations,
in the color map,
an area in the upper layer portion occupied by the crystal grains of which normal direction of a (001) plane is within ±10° with respect to a normal direction of the surface of the α-$Al_2O_3$ layer being equal to or more than 90%, and
an area in the lower layer portion occupied by the crystal grains of which normal direction of the (001) plane is within ±10° with respect to the normal direction of the surface of the α-$Al_2O_3$ layer being equal to or less than 50%, and
the α-$Al_2O_3$ layer having a stress distribution varying in the thickness direction,
the surface side of the α-$Al_2O_3$ layer having a compressive residual stress, and
the base material side of the α-$Al_2O_3$ layer having a tensile residual stress,
the coating includes a first intermediate layer between the base material and the α-$Al_2O_3$ layer,
the first intermediate layer is a TiCN layer,
the coating includes a second intermediate layer between the first intermediate layer and the α-$Al_2O_3$ layer,
the second intermediate layer is a TiCNO layer or a TiBN layer, and
a difference between a greatest thickness and a smallest thickness of the second intermediate layer is not smaller than 0.3 μm.
2. The surface-coated cutting tool according to claim 1, wherein the stress distribution has
a first region where an absolute value of the compressive residual stress continuously increases from the surface side toward the base material side, and
a second region located on the base material side relative to the first region, where an absolute value of the compressive residual stress continuously decreases and is turned to the tensile residual stress, and successively an absolute value of the tensile residual stress continuously increases, from the surface side toward the base material side, and
the first region and the second region are continuous, with an intermediate point where the absolute value of the compressive residual stress is greatest being interposed.
3. The surface-coated cutting tool according to claim 1, wherein the α-$Al_2O_3$ layer has an absolute value of the compressive residual stress not greater than 1000 MPa and an absolute value of the tensile residual stress not greater than 2000 MPa.
4. The surface-coated cutting tool according to claim 1, wherein the coating includes a surface layer located at an outermost surface, and
the surface layer is a TiC layer, a TiN layer, or a $TiB_2$ layer.
5. A surface-coated cutting tool, comprising:
a base material; and
a coating formed on the base material,
the coating including an α-$Al_2O_3$ layer containing a plurality of crystal grains of α-$Al_2O_3$,
the α-$Al_2O_3$ layer including a lower layer portion which is located on a base material side in a thickness direction and has a thickness of 1 μm and an upper layer portion which is located on a surface side opposite to the base material side and has a thickness of 2 μm,
when respective crystal orientations of the crystal grains are specified by performing electron beam backscattering diffraction analyses with a field emission-type scanning microscope, on a cross section obtained when the α-$Al_2O_3$ layer is cut along a plane including a normal line of a surface of the α-$Al_2O_3$ layer and a color map is prepared based on the crystal orientations,
in the color map,
an area in the upper layer portion occupied by the crystal grains of which normal direction of a (001) plane is within ±10° with respect to a normal direction of the surface of the α-$Al_2O_3$ layer being equal to or more than 90%, and
an area in the lower layer portion occupied by the crystal grains of which normal direction of the (001) plane is within ±10° with respect to the normal direction of the surface of the α-$Al_2O_3$ layer being equal to or less than 50%, and
the α-$Al_2O_3$ layer having a stress distribution varying in the thickness direction, wherein
the stress distribution has
a first region where an absolute value of the compressive residual stress continuously increases from the surface side toward the base material side, and
a second region located on the base material side relative to the first region, where an absolute value of the compressive residual stress continuously decreases and is turned to the tensile residual stress, and successively an absolute value of the tensile residual stress continuously increases, from the surface side toward the base material side, and
the first region and the second region are continuous, with an intermediate point where the absolute value of the compressive residual stress is greatest being interposed.
6. A surface-coated cutting tool, comprising:
a base material; and
a coating formed on the base material,
the coating including an α-$Al_2O_3$ layer containing a plurality of crystal grains of α-$Al_2O_3$,
the α-$Al_2O_3$ layer including a lower layer portion which is located on a base material side in a thickness direc- tion and has a thickness of 1 μm and an upper layer portion which is located on a surface side opposite to the base material side and has a thickness of 2 μm, when respective crystal orientations of the crystal grains are specified by performing electron beam backscattering diffraction analyses with a field emission-type scanning microscope, on a cross section obtained when the $\alpha$-$Al_2O_3$ layer is cut along a plane including a normal line of a surface of the $\alpha$-$Al_2O_3$ layer and a color map is prepared based on the crystal orientations, in the color map, an area in the upper layer portion occupied by the crystal grains of which normal direction of a (001) plane is within ±10° with respect to a normal direction of the surface of the $\alpha$-$Al_2O_3$ layer being equal to or more than 90%, and an area in the lower layer portion occupied by the crystal grains of which normal direction of the (001) plane is within ±10° with respect to the normal direction of the surface of the $\alpha$-$Al_2O_3$ layer being less than 45%, and the $\alpha$-$Al_2O_3$ layer having a stress distribution varying in the thickness direction, the surface side of the $\alpha$-$Al_2O_3$ layer having a compressive residual stress, and the base material side of the $\alpha$-$Al_2O_3$ layer having a tensile residual stress.

\* \* \* \* \*